US011955431B2

(12) United States Patent
Ong et al.

(10) Patent No.: US 11,955,431 B2
(45) Date of Patent: Apr. 9, 2024

(54) INTERPOSER STRUCTURES AND METHODS FOR 2.5D AND 3D PACKAGING

(71) Applicant: Intel Corporation, Santa Clara, CA (US)

(72) Inventors: Jenny Shio Yin Ong, Bayan Lepas Pulau Pinang (MY); Seok Ling Lim, Kulim Kedah (MY); Bok Eng Cheah, Gelugor Pulau Pinang (MY); Jackson Chung Peng Kong, Tanjung Tokong Pulau Pinang (MY); Saravanan Sethuraman, Bayan Lepas Pulau Pinang (MY)

(73) Assignee: Intel Corporation, Santa Clara, CA (US)

(*) Notice: Subject to any disclaimer, the term of this patent is extended or adjusted under 35 U.S.C. 154(b) by 740 days.

(21) Appl. No.: 16/987,437

(22) Filed: Aug. 7, 2020

(65) Prior Publication Data

US 2021/0384133 A1    Dec. 9, 2021

(30) Foreign Application Priority Data

Jun. 5, 2020 (MY) .............................. PI2020002899

(51) Int. Cl.
| | |
|---|---|
| *H01L 23/49* | (2006.01) |
| *H01L 21/48* | (2006.01) |
| *H01L 23/498* | (2006.01) |
| *H01L 23/538* | (2006.01) |
| *H01L 23/552* | (2006.01) |

(52) U.S. Cl.
CPC ........ *H01L 23/5385* (2013.01); *H01L 21/486* (2013.01); *H01L 23/49833* (2013.01); *H01L 23/49838* (2013.01); *H01L 23/5381* (2013.01); *H01L 23/5386* (2013.01); *H01L 23/552* (2013.01)

(58) Field of Classification Search
CPC ......... H01L 23/49833; H01L 23/49838; H01L 23/5381; H01L 23/5385; H01L 23/5386; H01L 23/552; H01L 21/486
USPC .......................................... 257/693
See application file for complete search history.

(56) References Cited

U.S. PATENT DOCUMENTS

2010/0213600 A1* 8/2010 Lau .................. H01L 23/5384
                                                                438/122

* cited by examiner

*Primary Examiner* — Monica D Harrison
(74) *Attorney, Agent, or Firm* — VIERING, JENTSCHURA & PARTNER MBB (57) ABSTRACT

Semiconductor packages, and methods for making the semiconductor packages, having an interposer structure with one or more interposer and an extension platform, which has an opening for placing the interposer, and the space between the interposer and the extension platform is filled with a polymeric material to form a unitary interposer-extension platform composite structure. A stacked structure may be formed by at least a first semiconductor chip coupled to the interposer and at least a second semiconductor chip coupled to the extension platform, and at least one bridge extending over the space that electrically couples the extension platform and the interposer. The extension platform may include a recess step section that may accommodate a plurality of passive devices to reduced power delivery inductance loop for the high-density 2.5D and 3D stacked packaging applications.

18 Claims, 8 Drawing Sheets

INTERPOSER STRUCTURES AND METHODS FOR 2.5D AND 3D PACKAGING

CROSS-REFERENCE TO RELATED APPLICATIONS

This application claims priority to Malaysian Patent Application No. PI2020002899, which was filed on Jun. 5, 2020, the entire contents of which are hereby incorporated herein by reference.

BACKGROUND

The use of 2.5D and 3D architecture permits multiple dies to be positioned inside the same package. In such packages, the communication between chips is accomplished using either a silicon or organic interposer, which is typically a chip or multi-layered structure with through-silicon vias (TSV) for communication. Such packaging methodology is typically used for applications when performance and low power are critical.

The purpose of an interposer is to redistribute a connection to a wider pitch or to reroute a connection to a different connection. While communication between chips may be slower than for single-chip communication, distances are shorter and there are more conduits for signals when interposers are employed for communication between multiple chips; collectively signal transmission bandwidth is higher and it requires less energy to drive those signals. In addition, distances can be shorter between chips in 2.5D and 3D package architecture than a connection between two discrete packages through a circuit board that can reduce signal performance and increase resistance and capacitance.

The interposers used in 2.5D and 3D architectures are relatively expensive to manufacture. Also, the form-factor for interposers in highly integrated devices, using chips or chiplets, in 2.5D and/or 3D packages presents an additional challenge, i.e., space constraints. Current solutions to mitigate the interposer form-factor issues include: (i) expansion of silicon interposer footprint, (ii) scaling through the use of advanced silicon process nodes to reduce the chip/chiplet footprints, and (iii) reduced TSV geometry to reduced the interposer footprints. However, expansion of the interposer footprint, with an increase in the associated TSV total count, and/or geometry scaling to support highly integrated stacked devices poses increased risks of manufacturing yield losses.

In addition, the 2.5D and 3D architecture typically require the use of decoupling capacitors to reduce the power delivery loop inductance (i.e, to suppress the power delivery network (PDN) peak impedance). Multiple-chip packages with silicon interposers and power delivery decoupling capacitors located on the package substrate landside may have extended interconnect paths and/or power loop inductance between the stacked silicon devices and the decoupling capacitors that lead to escalated power supply noise (PSN) induced "jitter" (i.e., deviations), and degradation in device performance and functionality. The package landside capacitor further causes ball grid array (BGA) density issues (i.e., I/O issues), due to the use of package landside "keep-out-zones" for the capacitor placement. The use of an additional EM shielding layer or routing structure to curb noise coupling between stacked devices and the silicon interposer requires trade-offs in terms of interconnect routing density and/or package z-height.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 5A, 5B and 5C' through 5H' show cross-sectional views directed to an exemplary process flow for a method of making a semiconductor package with passive devices according to a further aspect of the present disclosure.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

New approaches are needed for form-factor miniaturization for interposer in highly integrated devices in 2.5D and/or 3D packages. Also, the electrical performance impairments, e.g., signal attenuation losses, electromagnetic (EM) noise coupling among the stacked devices and/or latency across the platform interconnects, and the challenges of large PDN inductance loops in multi-chip packages need to be addressed.

The technical effects of the present disclosure may include an improvement in interposer form-factor miniaturization for highly integrated devices on 2.5D and/or 3D package and in their electrical performance, i.e., signal attenuation losses, EM noise coupling among the stacked devices and/or latency across the platform interconnects.

By using the present interposer structures, designers may keep the circuitry of each active chip internal to the device package and also may more easily "mix and match" active and passive chips by using the present interposer structure as a "rewiring platform" to connect chips without the need to specifically design them for interface compatibility. The present disclosure may be advantageously used for applications where performance and low power are critical.

In all aspects, the present disclosure generally relates to a device that may include one or more interposer and an extension platform, in which there may be at least one opening therein for placing the interposer. The interposer may be at least partially encircled or "framed" by the extension platform and separated by a space therefrom. The space may be filled with a polymeric material to form a unitary interposer-extension platform composite structure. There may be at least a first semiconductor chip coupled to the interposer and at least a second semiconductor chip coupled to the extension platform. There may be at least one bridge extending over the space that electrically couples the extension platform and the interposer. The interposer may be electrically coupled to a package substrate through a plurality of solder bumps.

To more readily understand and put into practice the aspects of the present semiconductor package, particular aspects will now be described by way of examples and not limitations, and with reference to the figures. For the sake of brevity, duplicate descriptions of features and properties may be omitted.

Figure 1:
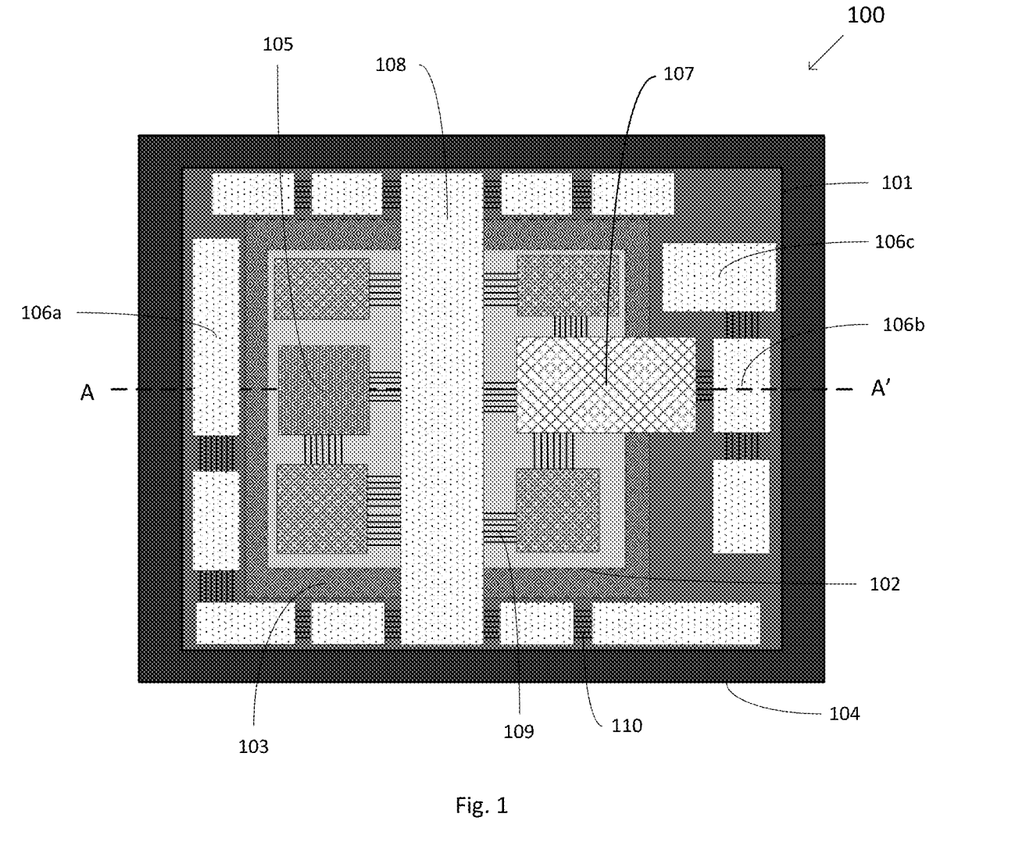
FIG. 1 shows a top view layout of a semiconductor package having an interposer and extension platform according to an aspect of the present disclosure.

In the aspect shown in FIG. 1, a semiconductor package 100 of the present disclosure is shown in a top view layout having, among other things, an extension platform 101 and an interposer 102, with a space or gap between them being filled with a mold material 103. The extension platform 101 and interposer 102 provide a versatile, unitary platform for the various semiconductor components (both active and passive), TSVs, electrical interconnects and routings, and other features, according to the aspects of the present disclosure. The advantageous use of an extension platform may permit a package design to have a reduced interposer footprint for highly integrated stacked devices. In an aspect, an extension platform may have a footprint that ranges from 50 to 80 percent of a package substrate surface area.

In FIG. 1, the semiconductor package 100 may have a package substrate 104. The package substrate 104 may have contact pads, electrical interconnects and routings, and other features, which are not shown in any of the present figures. The substrate 104 may have one or more rigid core layer for improved structural stability or maybe a coreless substrate package for a reduced form-factor. In other aspects, the package substrate 104 may be part of a larger substrate that supports additional semiconductor packages and/or components. In another aspect, the substrate 104 may be a motherboard.

As shown in FIG. 1, for the semiconductor package 100, a semiconductor chip 105, which may be a central processing unit (CPU) or another processor device, may be coupled to the interposer 102. The interposer 102 may be coupled to a plurality of other chips or chiplets, as shown positioned thereon; for example, a platform controller hub (PCH) or chipset with a plurality of active devices. The PCH may include a system clock, an input/output (I/O) interface e.g., a display interface, or a direct media interface. For the various couplings, the interposer 102 may have a metallization layer 113 (shown in FIG. 1A) to accommodate a plurality of conductive routing layers, e.g., signal routing and voltage reference layers isolated by a dielectric layer, as exemplified by routing lines 109.

In addition, for the semiconductor package 100, semiconductor chips 106a, 106b and 106c, which may be dynamic random access memory (DRAMs) or other memory devices, sensors, I/O tiles, RF devices, and/or a field programmable gate array (FPGA), may be coupled to the extension platform 101. The extension platform 101 may be coupled to a plurality of other chips or chiplets, as shown positioned thereon. For the various couplings, the extension platform 101 may have a metallization layer 114 (shown in FIG. 1A) to accommodate a plurality of conductive routing layers, e.g., signal routing and voltage reference layers isolated by a dielectric layer, as exemplified by routing lines 110.

According to the aspect shown in FIG. 1, the semiconductor package 100 may have a bridge chip 107 that is disposed over the mold material 103 and that couples the interposer 102 to the extension platform 101. In an aspect, the bridge chip 107 may have a plurality of conductive routing layers, e.g., signal routing and voltage reference layers isolated by dielectric layers, and maybe a primary electrical coupling between the chips on the interposer and the other chips on the extension platform. In an aspect, the bridge chip 107 may be a passive bridge with a high-speed I/O tile (e.g., a computer express link (CXL) interface). In another aspect, the bridge chip 107 may be an active bridge with active devices or switches such as metal-oxide-silicon (MOS) transistors or germanium transistors. In other aspects, as shown in an example set forth in FIG. 3, a semiconductor package may have a plurality of bridge chips.

As also shown in FIG. 1, the semiconductor package 100 may have a chip 108, with a first end, a mid-section and a second end, that may provide routings for various connections among and between chips on the interposer 102, chips on a first area of the extension platform 101, and chips on a second area of the extension platform 101. The chip 108 may be an active device. The first end of chip 108 may be disposed over and coupled to one or more chip on the first area of the extension platform 101, the mid-section of chip 108 may be disposed over the interposer 102 and coupled to one or more chip thereon, and the second end of chip 108 may be disposed over and coupled to one or more chip on the second area of the extension platform 101. The chip 108 may have a metallization layer 119 (shown in FIG. 1A) that may be used to provide shorter signal routes between the chips in the semiconductor package 100. In a further aspect, the chip 108 may carry power to chips on the interposer 102, i.e., to chips on the first area of the extension platform 101, and to chips on a second area of the extension platform 101.

The terms chip and chiplet are used and should be understood as being interchangeable within the scope of this disclosure. In addition, as understood herein, a chiplet may be an integrated circuit device that has been specifically designed to work with other similar chiplets to form a larger more complex device.

Also, as shown in FIG. 1, the extension platform 101 may encircle or "frame" the interposer 102. However, an extension platform may have a reduced size and need only partially encircle an interposer. As further discussed below with regard to FIG. 4, at least one opening may be formed in an extension platform material layer, with the opening being able to accommodate at least one interposer therein. In an aspect, the extension platforms of the present disclosure may be formed from organic-based materials (e.g., epoxy resins, polyester resin, vinyl ester, and/or ceramic polymer layer), or from semiconductor materials (e.g., silicon substrate materials).

As exemplified by the extension platform 101 in FIG. 1, an extension platform may have an asymmetric shape when there is need to accommodate chips of a certain size on a surface of the extension platform (e.g., chip 106a), and chips of another size on another surface of the extension platform (e.g., chips 106b and 106c). It should be understood that the extension platforms of the present disclosure may have various shapes and sizes depending on, for example, the number and types of chips positioned thereon, the shape of the interposers and/or the overall package size.

In an aspect, the interposer 102 may be a silicon die interposer (i.e., crystalline or polycrystalline silicon), an organic interposer (i.e., an organic material core with dielectric layers over the core), a ceramic interposer, or a glass interposer. However, in realizing the 2.5-D and 3-D packaging according to the present disclosure, an advantage may result from the use of a silicon interposer and the ability to produce fine-pitch interconnects and wiring. Although silicon is a well-established material technology used in the semiconductor industry, the cost for silicon interposer fabrication is still relatively high with the bulk of the cost related to the Damascene process, front pad, and backside bumping, TSV fabrication, and via filling. The use of the present extension platform may be able to offset some of these costs; for example, by allowing the reduction of interposer size and footprint.

In another aspect, the mold material 103 may be a bonding material between interposer 102 and the extension platform 101 to form a "composite" interposer structure. The mold material 103 may provide rigidity, along with a degree of flexibility, and may be formed of materials such as epoxy resin polymer, silicone polymer and/or polyimide materials.

In another aspect, the selection of materials for the components in the present disclosure may provide improved mechanical reliability for 2.5D/3D stacked packages through reduction of coefficient thermal expansion (CTE) mismatches; for example, between the package substrate (~15 ppm) and the conventional silicon interposer/bridge (~3 ppm), whereas an organic-molded silicon interconnect bridge has a CTE closer to the CTE of the organic-based package substrate.

Figure 1A:
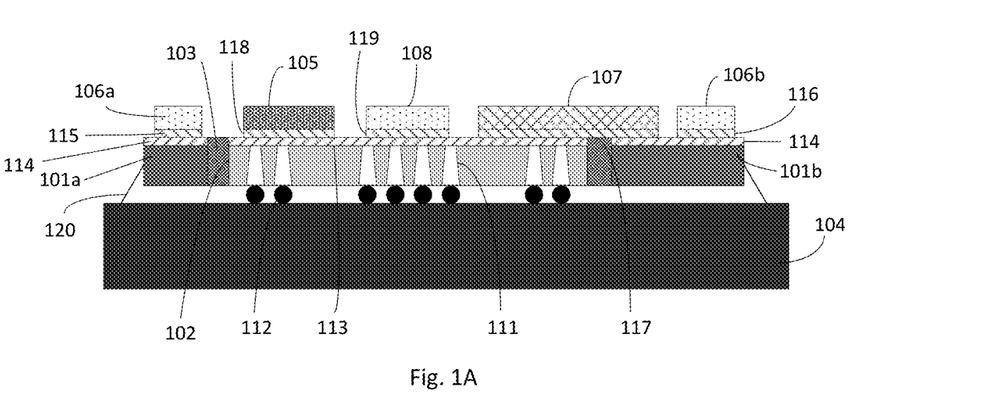
FIG. 1A shows a cross-sectional view of the semiconductor package according to the aspect as shown in FIG. 1.

FIG. 1A shows a cross-section view of the semiconductor package 100 according to the aspect as shown in FIG. 1 along the dashed A-A' line. As shown from this view, a composite structure may be formed by the extension platform section 101a, the interposer 102, the extension platform section 101b, which are bonded together by the mold material 103. It should be understood that the extension platform sections 101a and 101b are section views of extension platform 101 shown in FIG. 1. This structure provides a "base" support for coupling various chips, including the chips 105, 106a, 106b and 108, and the bridge chip 107 shown in FIG. 1A, used for semiconductor packages according to the present disclosure.

In an aspect shown in FIG. 1A, the extension platform 101, including sections 101a and 101b, may have a platform metallization layer 114 that may be coupled to various chips disposed on the interposer, including to a first chip metallization layer 115, which is formed on the chip 106a, and a second chip metallization layer 116, which is formed on the chip 106b, and partially coupled to a bridge metallization layer 117, which is formed on the bridge chip 107. In this aspect, the extension platform section 101b may be wider than the extension platform section 101a to provide sufficient surface space for supporting and coupling the bridge chip 107 and chip 106b. The coupling of the aforementioned chips may use conventional methods, including solder bonding, thermal compression bonding, or other metal diffusion method.

In another aspect shown in FIG. 1A, the interposer 102 may have a plurality of TSVs 111 that are correspondingly coupled to a plurality of solder bumps 112 and the interposer metallization layer 113. The interposer 102 may have interposer metallization layer 113 coupled to a third chip metallization layer 118, which is formed on the chip 105, and a fourth chip metallization layer 119, which is formed on the chip 108, and partially coupled to the bridge metallization layer 117, which is formed on the bridge chip 107. The coupling of the aforementioned chips may use conventional methods, including solder bonding, thermal compression bonding, or other metal diffusion method.

As shown in FIG. 1A, various chips, including the chip 105, 106a, 106b and 108 and the bridge chip 107, may be coupled to the extension platform 101 and the interposer 102, which acts as a base, to form a stacked component structure that may be coupled to the substrate 104 via the solder bumps 112 to complete the semiconductor package 100 of the present disclosure. An underfill material 120 may be provided to add strength to the semiconductor package 100. The underfill material 120 may be provided using either a conventional underfilling process or no-flow underfilling process to reduce the effects of thermal expansion and reduce the stress and strain on the solder bumps 112. In another aspect, the use of underfill material may include filling the spaces between chips on an extension platform and interposer and extending over these chips as well.

Figure 2:
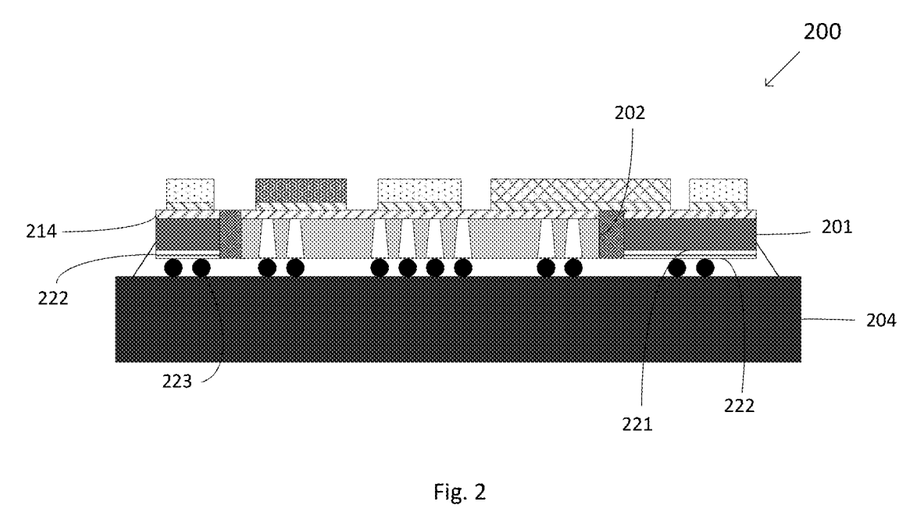
FIG. 2 shows a cross-sectional view of a semiconductor package with a shield layer according to another aspect of the present disclosure.

FIG. 2 shows a cross-sectional view of a semiconductor package 200 with a shield layer 222, according to another aspect of the present disclosure. Many of the aspects of the semiconductor package 200 are the same or similar to those of semiconductor package 100. In the aspect shown in FIG. 2, the shield layer 222 may, for example, be an electromagnetic interference (EMI) shield or a voltage reference plane, that may be disposed on at least a portion of a first surface 221 of an extension platform 201. The shield layer 222 may be positioned opposing a second surface of the extension platform 201 having a platform metallization layer 214 to reduce signal noise coupling between the various chips on the extension platform 201 and on an interposer 202, and a substrate 204. In another aspect, the shield layer 222 may include one or more metal layers coupled to a ground reference voltage (Vss) or a power reference voltage (Vcc) to facilitate a short signal current return path. In an aspect, the shield layer 222 may include a dielectric layer (not shown) sandwiched in between two adjacent voltage reference layers. As shown in FIG. 2, the shield layer may be coupled to the substrate 204 through one or more solder bumps 223.

For the sake of brevity, duplicate descriptions of features and properties are omitted. Accordingly, it will be understood that the descriptions of any feature and/or property relating to FIG. 3 and FIG. 3A that are the same or similar to a feature and/or property in FIG. 1 and FIG. 1A will have those descriptions be applicable hereinbelow as well.

Figure 3:
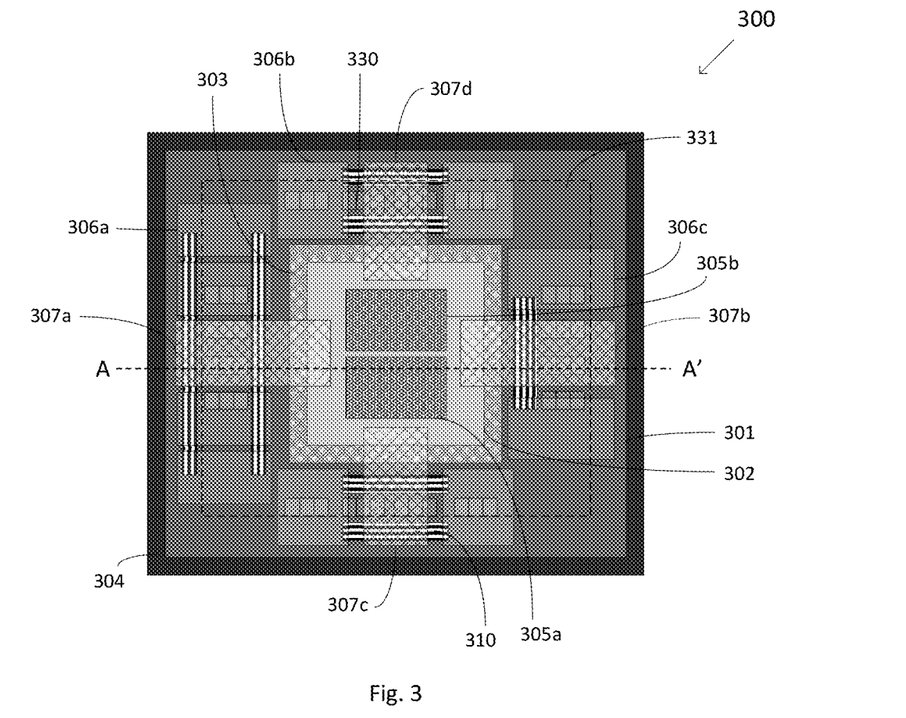
FIG. 3 shows a top view layout of the semiconductor package with passive devices according to a further aspect of the present disclosure.

In the aspect shown in FIG. 3, a semiconductor package 300, with passive devices 330, is shown in a top view layout having, among other things, an extension platform 301 and an interposer 302, with a space or gap between them being filled with a mold material 303. The extension platform 301 and interposer 302 provide a versatile, unitary platform for the various semiconductor components (both active and passive), TSVs, electrical interconnects and routings, and other features, according to the aspects of the present disclosure. In this aspect, the extension platform 301 has a recess step section 331 (shown as a dashed line) that may accommodate a plurality of passive devices 330, and other devices as well. The x-y footprint of a recess step section may range from 30 to 70 percent of the size of an extension platform. The semiconductor package 300 may have a package substrate 304.

Figure 3A:
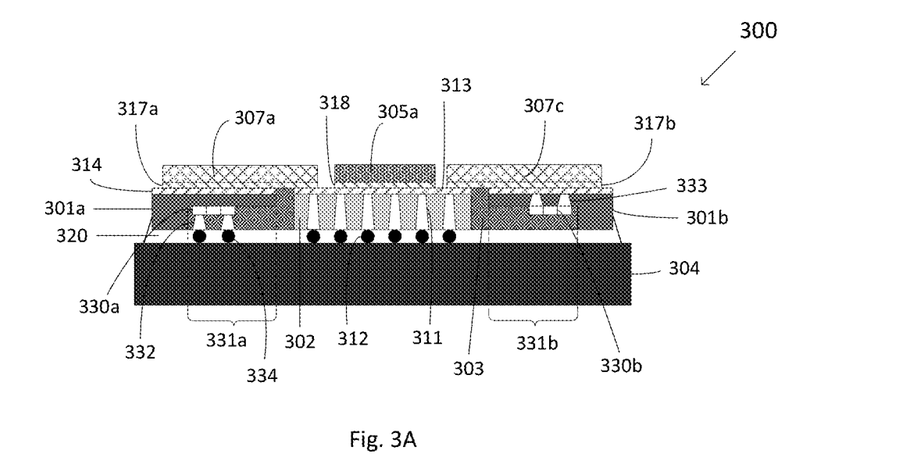
FIG. 3A shows a cross-sectional view of the semiconductor package according to the aspect shown in FIG. 3.

In FIG. 3, for the semiconductor package 300, there may be two semiconductor chips 305a and 305b, one of which may be a CPU and the other graphic processing unit (GPU), coupled to the interposer 302. Although not shown, it should be understood that interposer 302 may have additional chips or chiplets coupled to it. For the various couplings, the interposer 302 may need an interposer metallization layer 313 to accommodate a plurality of conductive routing layers, as shown in FIG. 3A.

In addition, for the semiconductor package 300, semiconductor chiplets 306a, 306b, and 306c, which may be DRAMs or other memory devices, may be coupled to the extension platform 301. The extension platform 301 may be coupled to a plurality of chips or chiplets, as shown positioned thereon. For the various couplings, the extension platform 301 may need a platform metallization layer 314 (shown in FIG. 3A) to accommodate a plurality of conductive routing layers, e.g., signal routing and voltage reference layers isolated by a dielectric layer, as exemplified by routing lines 310.

As shown in FIG. 3, the semiconductor package 300 may have a plurality of bridge chips 307a, 307b, 307c, and 307d that are disposed over the mold material 303 and that couples the interposer 302 to the extension platform 301. Each bridge chip may have a metallization layer with a plurality of conductive routing layers, e.g., signal routing and voltage reference layers isolated by dielectric layers, and maybe a direct electrical coupling between the chips on the interposer and certain other chips on the extension platform. In an aspect, the bridge chips 307 may be a passive or active silicon bridge chip. In other aspects, a semiconductor package may have one or up to several bridge chips, which may be dependent on the layout for the signal routing wiring and the number and types of chips on an extension platform.

According to the present disclosure, in the aspect shown in FIG. 3, an improved electrical performance (i.e., power integrity/delivery), through reduced package inductance loop for the high-density 2.5D and 3D stacked packaging applications may be achieved by using passive device 330. For example, the passive devices may include capacitors, resistors, inductors, transformers, and diodes, as being within the scope of the present disclosure. In an aspect of the present disclosure, the passive device may be a decoupling capacitor; specifically, it may be a multi-layer ceramic or a silicon capacitor. In an aspect, a direct connection between the power delivery decoupling capacitors and the associated power rail and ground network across the semiconductor package provides shorter loop inductance, hence improves the PDN impedance performance and signaling jitter reduction.

FIG. 3A shows a cross-sectional view of the semiconductor package 300 according to the aspect as shown in FIG. 3 along the dashed A-A' line. As shown from this view, a composite structure may be formed by the extension platform section 301a, the interposer 302, the extension platform section 301b, which are bonded together by the mold material 303. It should be understood that the extension platform sections 301a and 301b are section views of extension platform 301 shown in FIG. 3. This structure provides a base support for various chips, including the chip 305a and the bridge chips 307a and 307c shown in FIG. 3A, used in aspects of the semiconductor packages according to the present disclosure.

As shown in FIG. 3A, the extension platform sections 301a and 301b may have recess step sections 331a and 331b, respectively. It should be understood that the recess step sections 331a and 331b are section views at different parts of the recess step section 331 shown in FIG. 3 that frames interposer 302. The recess step section 331 may also allow for package footprint miniaturization through reduction of BGA keep-out-zone for passive device placement on package land-side and increased package BGA I/O density.

In an aspect shown in FIG. 3A, a passive device 330a is disposed on the recess step section 331a and a passive device 330b is disposed on the recess step section 331b. These passive devices may be multi-layer ceramic capacitors and/or silicon capacitors. In this aspect, the passive device 330a may be attached using, for example, solder paste or adhesive to the recess step section 331a and may be coupled to the substrate 304 through at least one mold via 332 and a mold solder bump 334. In another aspect, the passive device 330b is coupled to a platform metallization layer 314 through a step via 333, which allows for a shorter path to the chips (i.e., a shorter power loop inductance).

In an aspect, a combined height of the recess step section 331a, the passive device 330a, and the mold via 332 may be substantially equal to a height for the interposer 302. In a further aspect, a combined height of the step via 333, which is formed in the recess step section 331b, and the passive device 330b may be less than or equal to a height of the interposer 302.

In some aspects, a recess step section of an extension platform may be positioned on the interior side towards an interposer, for example, as shown in FIG. 3. It is within the scope of the present disclosure to position a recess step section on the exterior side, towards the periphery of a substrate, in order to achieve a desired stacked structure design. Moreover, it is within the scope of the present disclosure to have an extension platform with two or more step sections to achieve complex stacked structure designs.

In an aspect shown in FIG. 3A, the extension platform 301, including sections 301a and 301b, may have a platform metallization layer 314 that may be coupled to various chips disposed on the interposer, including to a first bridge metallization layer 317a, which is formed on the bridge chip 307a and a second bridge metallization layer 317b, which is formed on the bridge chip 307b. In this aspect, the extension platform section 301a may be approximately the same width as the extension platform section 301b to provide sufficient surface space for supporting and coupling the bridge chips 307a and 307b. The coupling of the aforementioned chips may use conventional methods, including solder bonding, thermal compression bonding, or other metal diffusion method.

In another aspect shown in FIG. 3A, the interposer 302 may have a plurality of TSVs 311 that are correspondingly coupled to a plurality of interposer solder bumps 312 and the interposer metallization layer 313. The interposer 302 may have an interposer metallization layer 313 that may be coupled to a chip metallization layer 318, which is formed on the chip 305a, and partially coupled to the first bridge metallization layer 317a and partially coupled to the second metallization layer 317b. The coupling of the aforementioned chips may use conventional methods, including solder bonding, thermal compression bonding, or other metal diffusion method.

In another aspect, the mold material 303 may be a bonding material between interposer 302 and the extension platform 301 to form the present interposer structure. The mold material 303 may also fill the recess step 331 and encase the passive devices 330 thereon; the passive devices 330a and 330b are encased as shown in FIG. 3A. As described above, the mold material 303 may have at least one mold via 332 that may be connected to the passive device 330a. The mold material 303 may provide rigidity, along with a degree of flexibility, and may be formed of materials such as epoxy resin polymer, silicone polymer and/or polyimide materials.

As shown in FIG. 3A, various chips, including the chip 305a, the bridge chips 307a and 307b, and the passive devices 330a and 330b, may be coupled to the extension platform 301 and the interposer 302, which acts as a base support, to form a stacked component structure that may be coupled to the substrate 304 via the interposer solder bumps 312 and the mold solder bumps 334 to complete the semiconductor package 300 of the present disclosure. An underfill material 320 may be provided to add strength to the semiconductor package 300.

For the sake of brevity, duplicate descriptions of features and properties are omitted. It will be understood that the descriptions of any feature and/or property relating to FIG. 4 and FIG. 4A that are the same or similar to a feature and/or property in FIG. 3 and FIG. 3A will have those descriptions be applicable hereinbelow as well.

Figure 4:
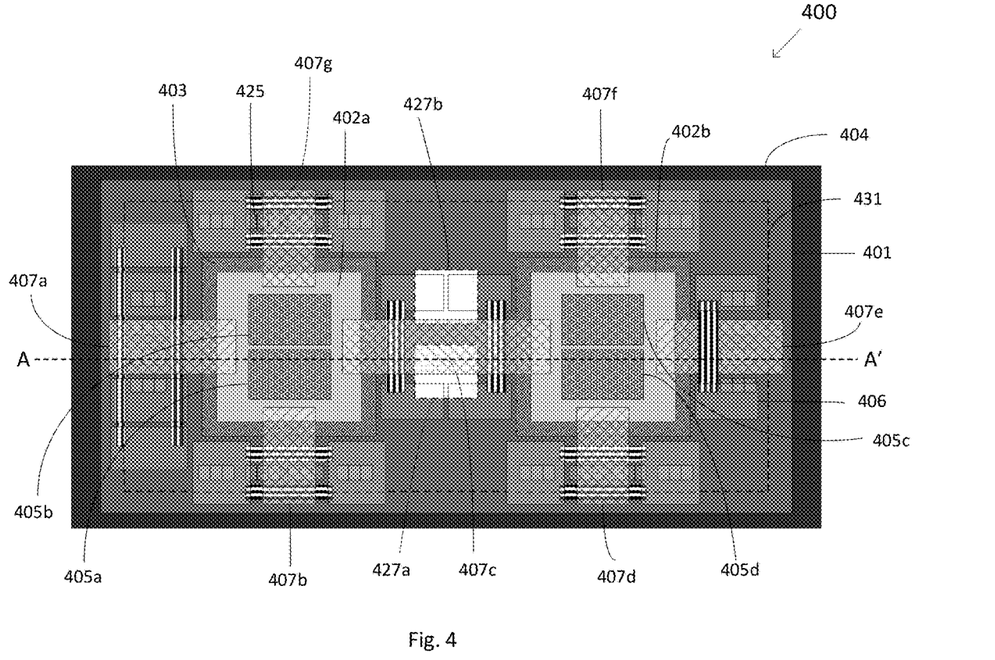
FIG. 4 shows a top view layout of a semiconductor package with two interposers according to yet another aspect of the present disclosure.

In the aspect shown in FIG. 4, a top view layout of a semiconductor package 400 is shown having, among other things, two interposers 402a and 402b framed by an extension platform 401 and a space between them being filled with a mold material 403. The extension platform 401 may have a recess step section 431 (shown as a dashed line) that may accommodate a plurality of passive devices 430 and "reverse" mounted chips 427a and 427b thereon. The extension platform 401 and interposers 402a and 402b provide a versatile, unitary platform for the various semiconductor components (both active and passive), TSVs, electrical interconnects, and routings, and other features, according to the aspects of the present disclosure. The semiconductor package 400 may have a package substrate 404.

In FIG. 4, for the semiconductor package 400, the two interposers may be used in place of a single, large interposer. In an aspect, there may be semiconductor chips 405a and 405b coupled to the interposer 402a, and semiconductor chips 405c and 405d coupled to the interposer 402b. Although not shown, it should be understood that interposers 402a and 402b may have additional chips or chiplets coupled to them. For the various couplings, the interposers 402a and 402b may have metallization layers as described in other aspects for interposers of the present disclosure.

In addition, as shown in FIG. 4, the extension platform 401 may be formed of silicon substrate materials and may encircle the interposers 402a and 402b, which may be disposed in openings formed in the extension platform 401. In an aspect, the recess step section 431 (shown as a dashed line) may be formed in the extension platform 401 to accommodate the plurality of passive devices 430 and the reverse mounted chips 427a and 427b (both shown as a dashed line). It should be understood the term "reverse" is used as being relative to the various semiconductor chips that may be coupled to the top surfaces of an interposer and extension platform of the present disclosure. In an aspect, the reverse mounted chips 427a and 427b may be chiplets, e.g., memory devices, sensors and/or input/output tiles. The extension platform 401 may have a plurality of chips or chiplets, as shown without reference numbers, coupled thereon. For the various couplings, the extension platform 401 may need a metallization layer 414 as described in other aspects for the extension platform of the present disclosure.

In an aspect, the semiconductor package 400 may have a plurality of bridge chips 407a, 407b, 407c, 407d, 407e, 407f and 407g that are disposed over the mold material 403 and that couples the interposers 402a and 402b to the extension platform 401. In the aspect shown in FIG. 4, the bridge chip 407c may have a first end, a mid-section and a second end that may provide routings for various connections among and between chips on the interposers 402a, which may be coupled to the first end, and 402b, which may be coupled to the second end, and the other chips on the extension platform 401. Each bridge chips may have a metallization layer with plurality of conductive routing layers, e.g., signal routing and voltage reference layers isolated by dielectric layers, and maybe a direct electrical coupling between the chips on the interposers and certain other chips on the extension platform.

In an aspect, the bridge chips 407 may be passive or active silicon bridge chips. In an aspect, passive bridges may be semiconductor devices with metallization layers (i.e., signal routings and reference planes) coupled to a silicon surface without any transistor devices (e.g., a transceiver) and serve as a channel that carries electrical signals and/or power delivery (non-logic processing capability). In another aspect, active silicon bridges may be semiconductor devices with active devices (e.g. transistor devices) disposed on an active silicon surface and a metallization layer (e.g., signal routings and reference planes) coupled to the active devices.

In other aspects, a semiconductor package may have one or up to several bridge chips, e.g., semiconductor package 400 has seven bridge chips, which may be dependent on the layout for the signal routing wiring and the number and types of chips on an extension platform.

Figure 4A:
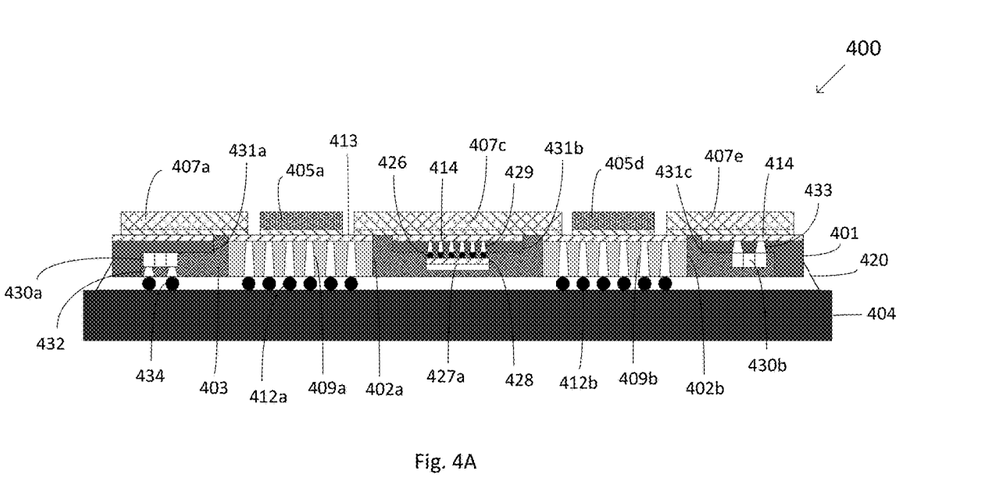
FIG. 4A shows a cross-sectional view of the semiconductor package according to the aspect shown in FIG. 4.

FIG. 4A shows a cross-sectional view of the semiconductor package 400 according to the aspect as shown in FIG. 4 along the dashed A-A' line. As shown from this view, a composite interposer structure may be formed by the extension platform 401 and the interposers 402a and 402b, which are bonded together by the mold material 403. This interposer structure provides the base support for various chips, including the semiconductor chip 405a and 405d and the bridge chips 407a, 407c and 407e shown in FIG. 4A, and is used to form a stacked component structure for the semiconductor packages according to the present disclosure.

As shown in FIG. 4A, the extension platform may have recess step sections 431a, 431b and 431c, with the recess step section 431b disposed between the interposers 402a and 402b. It should be understood that the recess step sections 431a, 431b, and 431c are section views of the recess step section 431 shown in FIG. 4. The recess step section 431 may allow for package footprint miniaturization through reduction of BGA keep-out-zone for passive device placement on package land-side and increased package BGA I/O density.

In an aspect shown in FIG. 4A, a passive device 430a is disposed on the recess step section 431a and a passive device 430b is disposed on the recess step section 431c. These passive devices may be multi-layer ceramic capacitors and/or silicon capacitors. In this aspect, the passive device 430a may be attached using, for example, solder paste to the recess step section 431a and may be coupled to the substrate 404 through at least one mold via 432 and a mold solder bump 434. In another aspect, the passive device 430b is coupled to a platform metallization layer 414 through a step via 433.

In an aspect, the recess step section 431b, which may be disposed between the interposers 402a and 402b, may have at least one TSV 429 with a solder bump 426 coupling a chip metallization layer 428 for the reverse mounted chip 427a to the platform metallization layer 414. In an aspect, the step via 433 and TSV 429 may be formed at the same time. In a further aspect, a combined height of the recess step section 431b, the reverse mounted chip 427a, the solder bumps 426 and the step via 429, which is formed in the recess step section 431b, may be less than or equal to heights of the interposers 402a and 402b.

In FIG. 4A, the stacked component structure may be coupled to the substrate 404 via the interposer solder bumps 412 and the mold solder bumps 434 to complete the semiconductor package 400 of the present disclosure. An underfill material 420 may be provided to add strength to the semiconductor package 400.

According to methods of the present disclosure, FIGS. 5A, 5B, 5C through 5H, and 5C' through 5H' show cross-section views directed to exemplary process flows for making the present semiconductor packages. In particular, according to aspects of the present disclosure, the FIGS. 5C through 5H may show an exemplary process flow for making a semiconductor package 500a, which is similar to the semiconductor package 100 shown in FIG. 1 and FIG. 1A, and the FIGS. 5C' through 5H' may show an exemplary process flow for making a semiconductor package 500b with passive devices, which is similar to the semiconductor package 300 shown in FIG. 3 and FIG. 3A.

Figure 5A:
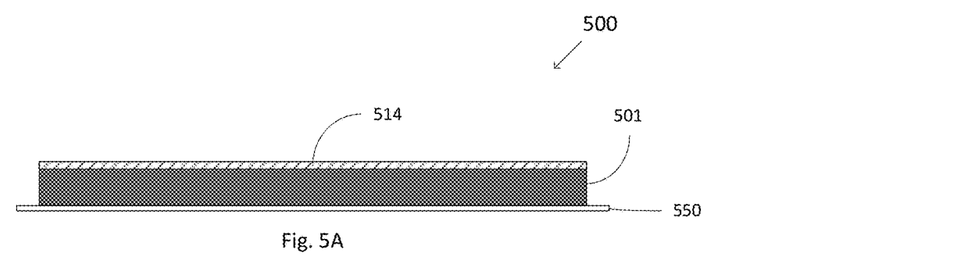
FIGS. 5A through 5H show cross-sectional views directed to an exemplary process flow for a method of making a semiconductor package according to an aspect of the present disclosure.

As shown in FIG. 5A, a semiconductor package 500 may be formed from an extension platform 501 having a platform metallization layer 514. In an aspect, the extension platform 501 may be pre-formed from organic-based materials or silicon substrate materials using conventional methods and attached to a carrier 550. Alternatively, the platform extension 501 may be deposited and etched on the carrier 550, and the metallization layer 514 formed thereon. The platform metallization layer 514, which may have a plurality of conductive routing layers, may be formed on the extension platform 501 using standard electroplating and etching steps. Although not shown, in some aspects when needed, a shield layer may be formed on the surface opposite the platform metallization layer 514 by a conventional process, e.g., metal lamination or electroplating process.

Figure 5B:
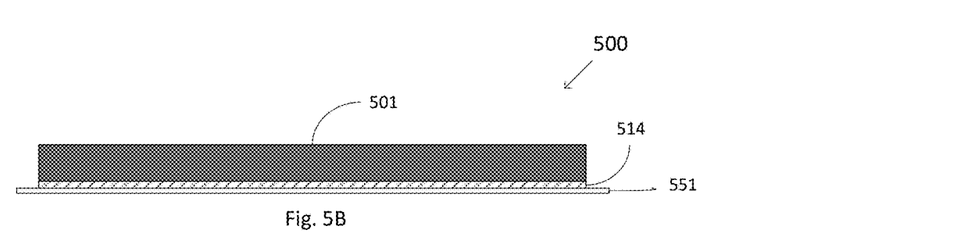

In FIG. 5B, according to the present disclosure, the extension platform 501 with the platform metallization layer 514 may be detached from carrier 550 and then inverted for placement the platform metallization layer 514 onto carrier 551. From this point, the process flow may be modified to make a semiconductor package 500a or 500b.

According to aspects of the present disclosure, a carrier, including the carriers 550, 551, and 552 disclosed herein, may be a glass carrier. In a conventional process to attach a carrier, a light to heat conversion (LTHC) release layer may be applied to the carrier, and then components may be attached to the LTHC release layer with an adhesive. After performing a step in the processing flow, to detach the carrier, a laser is used to compromise the LTHC release layer, and the carrier is removed. The adhesive may then be peeled off from the components.

Figure 5C:
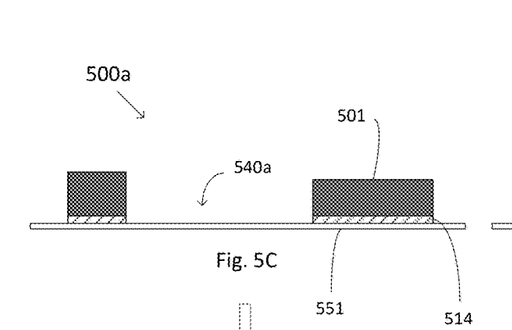

In the aspects shown in FIGS. 5C and 5C', one or more opening may be formed in the extension platform 501 with the platform metallization layer 514 by a laser or mechanical drilling process. In addition, an opening may, for example, be formed to accommodate one or more interposers. It is also possible to use reactive ion etching to form the openings.

In the aspect shown in FIG. 5C, in forming the semiconductor package 500a, an opening 540a may be formed in the extension platform 501 and in the platform metallization layer 514 to expose a top surface of the carrier 551 in a single patterning step by laser or mechanical drilling.

Figure 5D:
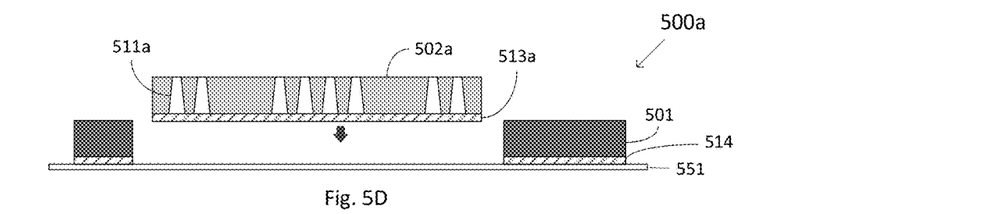

In FIG. 5D, according to a further aspect in forming the semiconductor package 500a, an interposer 502a, which may be separately formed, may be placed into the opening 540a and attached to the carrier 551 by a standard method, e.g., a hot press lamination process. In an aspect, the interposer 502a may have a plurality of TSVs 511a and an interposer metallization layer 513a. The interposer 502a and interposer metallization layer 513a may have a height that is approximately the same as a height for the extension platform 501 and the platform metallization layer 514.

Figure 5E:
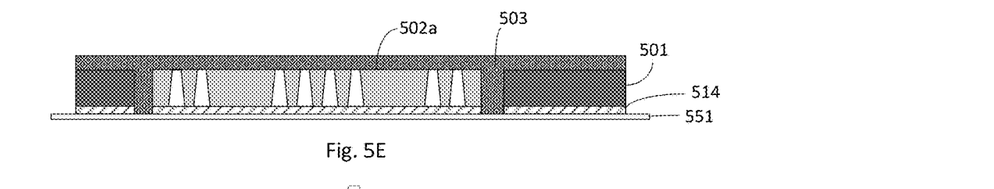

In FIG. 5E, according to a further aspect in forming the semiconductor package 500a, a space between the interposer 502a and the extension platform 501 may be used to fill by a mold material 503 using conventional methods, e.g., transfer molding, compression molding, injection molding, etc. The mold material 503 may provide rigidity, along with a degree of flexibility, and may be formed of materials such as epoxy resin polymer, silicone polymer, and/or polyimide materials.

Figure 5F:
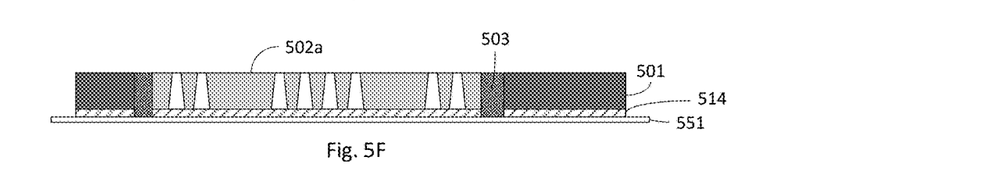

In FIG. 5F, according to a further aspect in forming the semiconductor package 500a, the mold material 503 may be planarized by standard mechanical grinding/polish process or chemical mechanical polishing (CMP) to remove excess material from the interposer 502a and platform extension 501 and form a level backside surface.

Figure 5G:
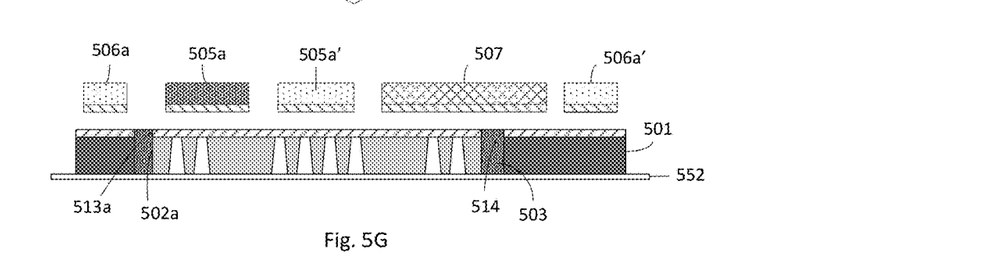

In FIG. 5G, according to a further aspect in forming the semiconductor package 500a, the extension platform 501 and the interposer 502a, bonded by the mold material 503 may be detached from carrier 551 and then inverted for attachment to carrier 552, having their metallization layers forming a top surface. In this aspect, various chips needed for semiconductor package 500a, including semiconductor chips 505a, 505a', 506a, 506' and a bridge chip 507, may be coupled to the extension platform 501 and the interposer 502a, which acts as a base support to form a stacked component structure. The coupling of the aforementioned chips may use conventional methods, including solder bonding, thermal compression bonding, or other metal diffusion method.

Figure 5H:
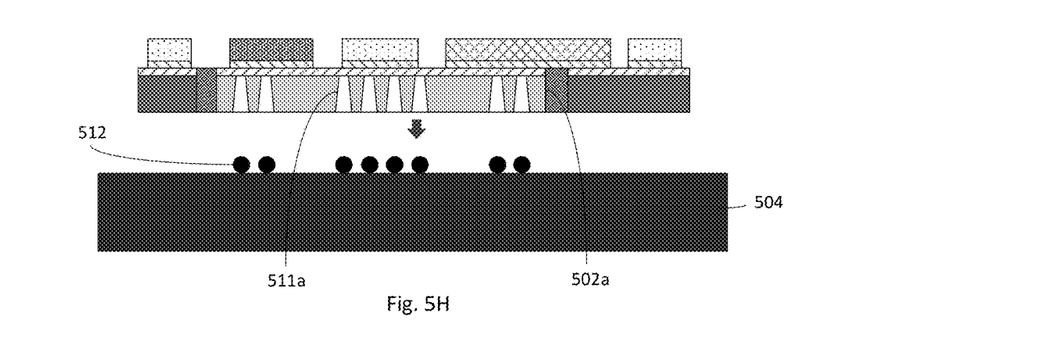

In FIG. 5H, according to a further aspect in forming the semiconductor package 500a, the stacked component structure from FIG. 5G may be coupled to the substrate 504 by solder bumps 512 coupled corresponding TSVs 511a of the interposer 502a. An underfill material (not shown) may be provided to add strength to the semiconductor package 500a, which completes the semiconductor package 500a of the present disclosure, using either a conventional underfilling process or no-flow underfilling process to reduce the effects of thermal expansion and reduce the stress and strain on the solder bumps 512.

Another aspect of the process flow is shown in FIG. 5C', in forming the semiconductor package 500b, an opening 540b may be formed in the extension platform 501 and the platform metallization layer 514 by laser or mechanical drilling in a two-part patterning step—in the first part, material may be removed according to a large pattern to form a recess step section 531 in the platform extension 501, and in a second part, more material may be removed according to a smaller pattern to expose a top surface of the carrier 551 to complete the opening 540b. Alternatively, the smaller pattern may be used first to expose a top surface of the carrier 551, followed by the large pattern to form the recess step section 531.

In FIG. 5D', according to a further aspect in forming the semiconductor package 500b, the recess step section 531 has at least one step via 533. An opening for the step via 533 may be formed by a laser or mechanical drilling processing step and filled with a conductive material, e.g., copper, using an electroless and/or an electrolytic process to form the step vias 533.

For aspects related to forming conductive vias in the present disclosure, the choice between an electroless and electrolytic process is that an electroless process does not require the application of an external electrical current to drive the deposition whereas the electrolytic process does. In addition, an electroless process uses a chemical reducing agent within the solution chemistry which results in nearly uniform deposition on all surfaces that are wetted by the chemistry. According to the present disclosure, the electroless plating process may be used to the conductive vias, followed by the electrolytic plating process to achieve reduced plating time with an externally supplied direct current.

In FIG. 5E', according to a further aspect in forming the semiconductor package 500b, an interposer 502b, which may be separately formed, may be placed into the opening 540b and attached to the carrier 551 by a standard method, e.g., a hot press lamination process. In an aspect, the interposer 502b may have a plurality of TSVs 511b and an interposer metallization layer 513b. A height for the interposer 502b and the interposer metallization layer 513b may be approximately the same as a height for the extension platform 501 and the platform metallization layer 514.

In addition, according to a further aspect in forming the semiconductor package 500b, passive devices 530a and 530b, which may be separately formed, may be attached to the recess step section 531. The passive device 530a may be attached to the recess step section by a standard method, e.g., an adhesive or solder paste, and the passive device 530b may be attached to the step vias in the recess step section by a solder paste 535 using a standard method, e.g., a thermal compression bonding process, or a solder reflow process.

In FIG. 5F', according to a further aspect in forming the semiconductor package 500b, a mold material 503 may be used to fill the space between the interposer 502b and the extension platform 501, as well as encase the passive devices 530a and 530b, by conventional methods, e.g., transfer molding, compression molding, injection molding, etc. The mold material 503 may provide rigidity, along with a degree of flexibility, and may be formed of materials such as epoxy resin polymer, silicone polymer and/or polyimide materials.

In addition, according to a further aspect in forming the semiconductor package 500b, at least one mold via 532 (shown in FIG. 5G') may be formed to connect with passive device 530a. At least one opening 534 may be formed by a laser or mechanical drilling processing step and filled with a conductive material, e.g., copper, using an electroless and/or an electrolytic process.

In FIG. 5G', according to a further aspect in forming the semiconductor package 500b, the extension platform 501 and the interposer 502b, bonded by the mold material 503 may be detached from carrier 551 and then inverted for attachment to carrier 552, with their metallization layers forming a top surface. In an aspect, various chips, including the semiconductor chips 505b, and the bridge chips 507b and 507b', may be coupled to a base support formed the extension platform 501 and the interposer 502 with the passive devices to complete a stacked component structure. The coupling of the aforementioned chips may use conventional methods, including solder bonding, thermal compression bonding, or other metal diffusion method.

In FIG. 5H', according to a further aspect in forming the semiconductor package 500b, the stacked component structure from FIG. 5G' may be coupled to the substrate 504 by solder bumps 512 coupled corresponding TSVs 511b of the interposer 502b and by mold solder bumps 534, which are coupled to mold vias 532 connected to the passive device 530a. An underfill material (not shown) may be provided to add strength to the semiconductor package 500b, which completes the semiconductor package 500a of the present disclosure, using either a conventional underfilling process or no-flow underfilling process to reduce the effects of thermal expansion and reduce the stress and strain on the solder bumps 512 and 534.

The fabrication methods and the choice of materials are intended to permit the present semiconductor packages to improve electrical performance and device miniaturization. It will be apparent to those ordinary skilled practitioners that the foregoing process operations may be modified without departing from the spirit of the present disclosure.

Figure 6:
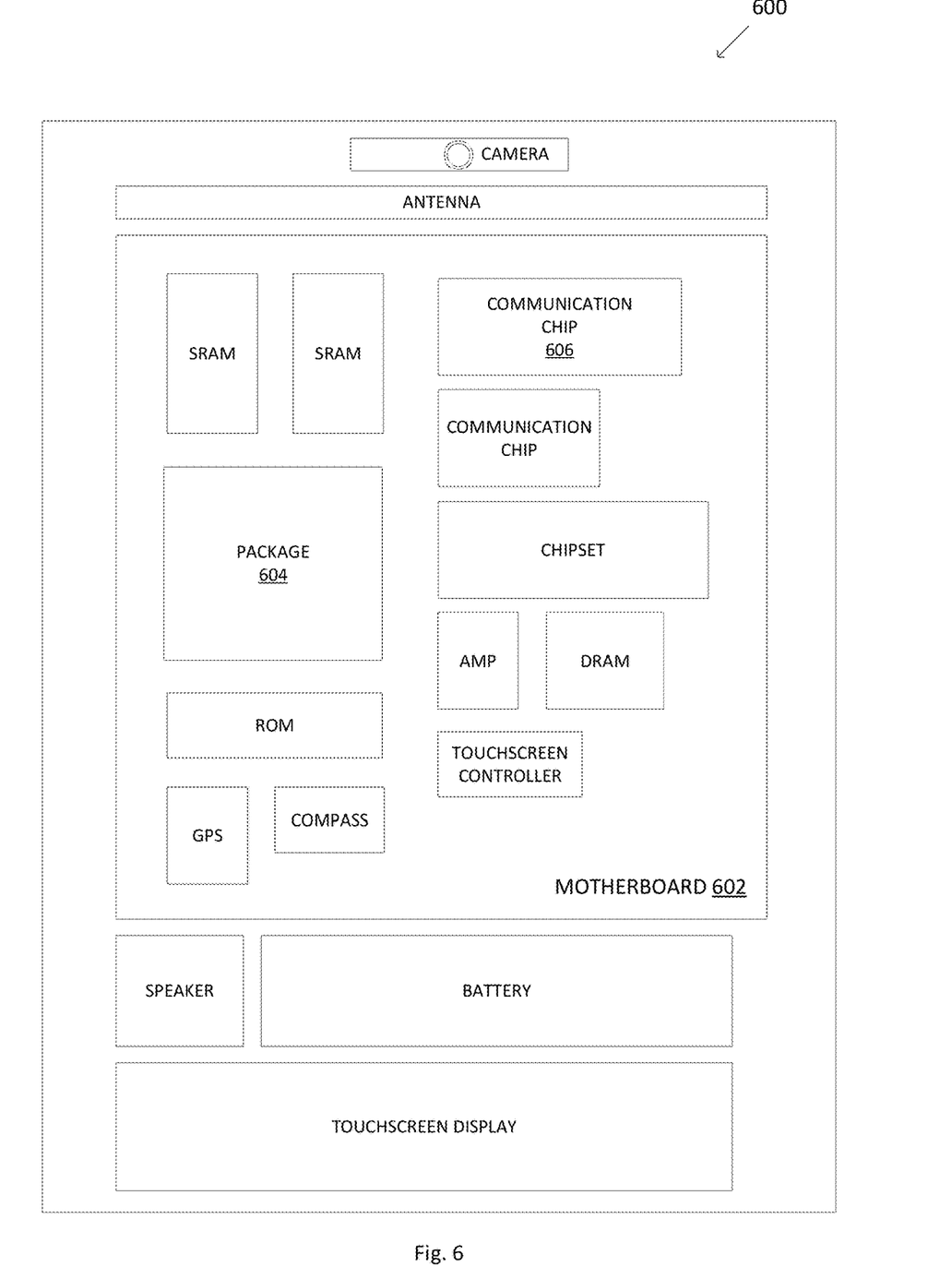
FIG. 6 shows an illustration of a computing device that includes a semiconductor package according to a further aspect of the present disclosure.

Aspects of the present disclosure may be implemented into a system using any suitable hardware and/or software. FIG. 6 schematically illustrates a computing device 600 that may include a 2.5D/3D semiconductor package as described herein, in accordance with some aspects. The computing device 600 may house a board such as a motherboard 602. The motherboard 602 may include several components, including but not limited to a semiconductor package 604, according to the present disclosure, and at least one communication chip 606. The semiconductor package 604, which may include an extension platform and interposer structured to support various chips according to the present disclosure, may be physically and electrically coupled to the motherboard 602. In some implementations, the at least one communication chip 606 may also be physically and electrically coupled to the motherboard 602.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the semiconductor package 604 of the computing device 600 may be packaged in a semiconductor package with a plurality of passive devices, as described herein, and/or other semiconductor devices may be packaged together in a 2.5D/3D semiconductor package, as described herein.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 606 may implement any of several wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 606 may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other aspects.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 600 may be a mobile computing device. In further implementations, the computing device 600 may be any other electronic device that processes data.

EXAMPLES

Example 1 may include a device with an extension platform, the extension platform having at least one opening; an interposer in the opening in the extension platform, in which the interposer is separated by a space from the extension platform and is at least partially encircled by the extension platform; at least one bridge coupling the extension platform and the interposer; and a substrate, in which the interposer is coupled to the substrate.

Example 2 may include the device of example 1 and/or any other example disclosed herein including the extension platform having a recess-step portion.

Example 3 may include the device of example 2 and/or any other example disclosed herein including the recess-step portion having at least a third semiconductor device positioned thereon.

Example 4 may include the device of example 3 and/or any other example disclosed herein in which the third semiconductor device is a multi-layer ceramic capacitor and/or a silicon capacitor.

Example 5 may include the device of example 3 and/or any other example disclosed herein including the recess-step portion having at least one conductive via coupled to the third semiconductor device.

Example 6 may include the device of example 3 and/or any other example disclosed herein including the third semiconductor device on the recess-step portion is coupled by a conductive via to the substrate.

Example 7 may include the device of example 2 and/or any other example disclosed herein in which the at least one opening in the extension platform further includes two openings with a section of the recess-step portion positioned therebetween.

Example 8 may include the device of example 6 and/or any other example disclosed herein including the section of the recess-step portion having at least another conductive via coupled to at least a fourth semiconductor device.

Example 9 may include the device of example 5 and/or any other example disclosed herein including a height of the third semiconductor device and the at least one conductive via coupled together may be less than or equal to a height of the interposer.

Example 10 may include the device of example 7 and/or any other example disclosed herein including each of the two openings having a first and second interposers positioned, respectively, therein.

Example 11 may include the device of example 1 and/or any other example disclosed herein including a polymeric material filling the space between the interposer and the extension platform.

Example 12 may include the device of example 11 and/or any other example disclosed herein in which the polymeric material is an epoxy resin polymer, a silicone polymer, or a polyimide material.

Example 13 may include the device of example 1 and/or any other example disclosed herein including at least a first semiconductor chip coupled to the interposer.

Example 14 may include the device of example 13 and/or any other example disclosed herein in which each of the first plurality of semiconductor chips includes a first chip metallization layer.

Example 15 may include the device of example 13 and/or any other example disclosed herein in which the first plurality of semiconductor chips includes a central processor unit (CPU) and/or graphic processing unit (GPU).

Example 16 may include the device of example 1 and/or any other example disclosed herein including at least a second semiconductor chip coupled to the extension platform.

Example 17 may include the device of example 16 and/or any other example disclosed herein in which each of the second plurality of semiconductor chips includes a second chip metallization layer.

Example 18 may include the device of example 16 and/or any other example disclosed herein in which the second plurality of semiconductor chips includes a field programmable gate array (FPGA) and/or a DRAM device.

Example 19 may include the device of example 1 and/or any other example disclosed herein including a connecting chip that extends from an encircling side of the extension platform over the interposer and extends to another encircling side of the extension platform.

Example 20 may include the device of example 1 and/or any other example disclosed herein including a first metallization layer on the interposer.

Example 21 may include the device of example 1 and/or any other example disclosed herein including a second metallization layer on the extension platform.

Example 22 may include the device of example 1 and/or any other example disclosed herein including a shield layer on the extension platform; in which the shield layer may be an electromagnetic interference (EMI) shield or voltage reference plane and further include one or more metal layers coupled to a ground reference voltage (Vss) or a power reference voltage (Vcc) to facilitate short signal current return path and be coupled to the package substrate through one or more solder bumps.

Example 23 may include the device of example 1 and/or any other example disclosed herein including the bridge having a bridge metallization layer for coupling the extension platform and the interposer.

Example 24 may include the device of example 1 and/or any other example disclosed herein including the bridge having at least one active semiconductor device.

Example 25 may include the device of example 1 and/or any other example disclosed herein including the bridge having at least one semiconductor device with metallization layers (i.e., signal routings and reference planes) coupled to a silicon surface without any transistor devices (e.g., a transceiver) and serves as a channel that carries electrical signals and/or power delivery (non-logic processing capability).

Example 26 may include the device of example 15 and/or any other example disclosed herein in which the bridge is a high-speed I/O tile including a computer express link (CXL) interface.

Example 27 may include the device of examples 14, 17, 20, 21, and 23 and/or any other example disclosed herein in which the metallization layers include a plurality of conductive routing layers isolated within a dielectric layer.

Example 28 may include the device of example 1 and/or any other example disclosed herein in which the extension is made from a material selected from a silicon-based material, an organic material, a polymer, and an epoxy resin polymer.

Example 29 may include the device of example 1 and/or any other example disclosed herein in which the interposer includes a plurality of through-silicon vias (TSVs).

Example 30 may include a method including providing a platform material and patterning to form an extension platform having at least one opening; positioning an interposer in the opening and separated by a space from the extension platform; filling the space between the interposer and the extension platform with a polymeric material; positioning a bridge between the extension platform and the interposer, in which the bridge couples the extension platform and the interposer; positioning a first semiconductor chip over the interposer and coupling the first semiconductor chip to the interposer, and positioning a second semiconductor chip over the extension platform and coupling the second semiconductor chip to the extension platform.

Example 31 may include the method of example 31 and/or any other example disclosed herein including patterning the platform material to form a recess-step portion; forming at least one conductive via in the recess-step portion; and positioning at least a third semiconductor device on the recess-step portion.

Example 32 may include a computing device including a circuit board; and a semiconductor package, in which the semiconductor package includes: a substrate having top and bottom surfaces, in which the bottom surface of the substrate is coupled to the circuit board; an extension platform positioned over the top surface of the substrate, the extension platform having at least one opening; an interposer positioned in the opening and separated by a space from the extension platform, in which the interposer is coupled to the top surface of the substrate; a polymeric material filling the space between the interposer and the extension platform; a bridge coupling the extension platform and the interposer; at least a first semiconductor chip coupled to the interposer; and at least a second semiconductor chip coupled to extension platform.

Example 33 may include the computing device of example 33 and/or any other example disclosed herein including the extension platform having a recess-step portion having at least a third semiconductor device thereon.

Example 34 may include the computing device of example 33 and/or any other example disclosed herein in which the computing device is a mobile computing device further including one or more of an antenna, a display, a touchscreen display, a touchscreen controller, a battery, a power amplifier, a global positioning system (GPS) device, a compass, a speaker, and/or a camera coupled with the circuit board.

In a further example, any one or more of examples 1 to 34 may be combined.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
an extension platform, the extension platform having at least one opening and a recess-step portion;
an interposer in the opening in the extension platform, wherein the interposer is separated by a space from the extension platform and is at least partially encircled by the extension platform;
at least one bridge coupling the extension platform and the interposer; and
a substrate, wherein the interposer is coupled to the substrate.

2. The device of claim 1, further comprising the recess-step portion having at least a third semiconductor device positioned thereon.

3. The device of claim 2, further comprising the recess-step portion having a first conductive via coupled to the third semiconductor device.

4. The device of claim 2, further comprising the third semiconductor device on the recess-step portion is coupled by a second conductive via to the substrate.

5. The device of claim 1, wherein the at least one opening in the extension platform further comprises two openings with a section of the recess-step portion positioned therebetween.

6. The device of claim 5, further comprising the section of the recess-step portion having a third conductive via coupled to at least a fourth semiconductor device.

7. The device of claim 5, further comprising each of the two openings having a first and second interposers positioned, respectively, therein.

8. The device of claim 1, further comprising a polymeric material filling the space between the interposer and the extension platform.

9. The device of claim 1, further comprising at least a first semiconductor chip coupled to the interposer.

10. The device of claim 9, further comprising at least a second semiconductor chip coupled to the extension platform.

11. The device of claim 1, further comprising a connecting chip extending from an encircling side of the extension platform over the interposer and extends to another encircling side of the extension platform.

12. The device of claim 1, further comprising a first metallization layer on the interposer and a second metallization layer on the extension platform.

13. The device of claim 1, further comprising a shield layer on the extension platform.

14. The device of claim 1, further comprising the bridge having a bridge metallization layer for coupling the extension platform and the interposer.

15. The device of claim 14, wherein the bridge further comprises a semiconductor device with metallization layers that carry electrical signals and/or delivers power, wherein the semiconductor device is a passive device or an active device.

16. A method comprising:
providing a platform material and patterning to form an extension platform having at least one opening and a recess-step portion;
positioning an interposer in the opening, separated by a space from and encircled by the extension platform;
filling the space between the interposer and the extension platform with a polymeric material;
positioning a bridge between the extension platform and the interposer, wherein the bridge couples the extension platform and the interposer;
positioning a first semiconductor chip over the interposer and coupling the first semiconductor chip to the interposer; and
positioning a second semiconductor chip over the extension platform and coupling the second semiconductor chip to the extension platform.

17. The method of claim 16, further comprises:
forming at least one conductive via in the recess-step portion; and
positioning at least a third semiconductor device on the recess-step portion.

18. A computing device comprising:
a circuit board; and
a semiconductor package, wherein the semiconductor package further comprises:
a substrate having top and bottom surfaces, wherein the bottom surface of the substrate is coupled to the circuit board;
an extension platform positioned over the top surface of the substrate, the extension platform having at least one opening and a recess-step portion having at least a third semiconductor device thereon;
an interposer in the opening and separated by a space from the extension platform, wherein the interposer is coupled to the top surface of the substrate;
a polymeric material filling the space between the interposer and the extension platform; a bridge coupling the extension platform and the interposer;
a first plurality of semiconductor chips coupled to the interposer; and
a second plurality of second semiconductor chips coupled to the extension platform, wherein the semiconductor package is coupled to the circuit board.

* * * * *